(12) United States Patent
Gold et al.

(10) Patent No.: US 6,937,958 B2
(45) Date of Patent: Aug. 30, 2005

(54) CONTROLLER FOR MONITORING TEMPERATURE

(75) Inventors: Spencer Gold, Pepperell, MA (US); Claude R. Gauthier, Fremont, CA (US); Kenneth House, Arlington, MA (US); Kamran Zarrineh, Nashua, NH (US)

(73) Assignee: Sun Microsystems, Inc., Santa Clara, CA (US)

( * ) Notice: Subject to any disclaimer, the term of this patent is extended or adjusted under 35 U.S.C. 154(b) by 190 days.

(21) Appl. No.: 10/079,475

(22) Filed: Feb. 19, 2002

(65) Prior Publication Data

US 2003/0158696 A1 Aug. 21, 2003

(51) Int. Cl.[7] ................................................. G01K 1/08
(52) U.S. Cl. ...................................... 702/132; 374/178
(58) Field of Search ................................ 702/132, 130; 374/178; 716/4; 713/300

(56) References Cited

U.S. PATENT DOCUMENTS

| | | |
|---|---|---|
| 3,379,214 A | 4/1968 | Weinberg |
| 4,165,642 A | 8/1979 | Lipp |
| 4,201,087 A | 5/1980 | Akita et al. |
| 4,305,041 A | 12/1981 | Frerking |
| 4,371,271 A | 2/1983 | Bellet |
| 4,551,031 A | 11/1985 | Ishikawa et al. |
| 4,559,954 A | 12/1985 | Murase |
| 4,658,407 A | 4/1987 | Iwama |
| 4,692,710 A | 9/1987 | Shvartsman |
| 4,754,760 A | 7/1988 | Fukukita et al. |
| 4,905,701 A | 3/1990 | Cornelius |
| 5,085,526 A | 2/1992 | Sawtell et al. |
| 5,097,198 A | 3/1992 | Holmdahl |
| 5,193,387 A | 3/1993 | Hodate |

(Continued)

OTHER PUBLICATIONS

Dallas Semiconductor, Application Note 105, "High Resolution Temperature Measurement With Dallas Direct-to-Digital Temperature Sensors" Retrieved from the Internet, www.dalsemi.com, pp. 1–20 (Aug. 11, 1999).
Dallas Semiconductor, Product Guide, "DS1721 2–Wire Digital Thermometer and Thermostat" pp. 1–14 (Dec. 29, 1998).
Intel Corporation 2000, Product Guide "Intel® 4 Processor In the 423–pin Package Thermal Design Guidelines" Order No.:249203–001, pp. 1–28 (Nov. 2000).
Maxim Integrated Products "Maxim Remote/Local Temperature Sensor with SMBus Serial Interface: MAX1617" pp. 1–20 (Mar. 1998).
Gunther et al. "Managing the impact of increasing microprocessor power consumption." pp. 1–9 http://www.intel.com/technology/itj/q12001/articles/art 4.htm (2001) Intel Technology Journal Q1.
Intel Corporation "Mobile Pentium ® II Processor and Pentium II Processor Mobile Module Thermal Sensor Interface specifications." 13 pages (Apr. 1998) http://www.intel.com/design/mobile/applnots/24372401.pdf.

Primary Examiner—John Barlow
Assistant Examiner—Xiuqin Sun
(74) Attorney, Agent, or Firm—Lahive & Cockfield, LLP

(57) ABSTRACT

A controller and method are provided for monitoring and controlling a temperature of an integrated circuit to inhibit damage from a thermal problem. The controller and method allow for individual temperature thresholds for each of one or more temperature sensors. Digital filtering of values received from temperature sensors is also provided. A variety of actions can be selected for execution upon a determination of an over-temperature condition of the integrated circuit, including assert an over-temperature pin, assert an over-temperature bit in an error register of said controller, assert an over-temperature bit in an error register of said microprocessor, issue an over-temperature interrupt to a service bus of said integrated circuit, cause a trap, slow an operating frequency of said integrated circuit, stop said integrated circuit, and do nothing.

28 Claims, 6 Drawing Sheets

U.S. PATENT DOCUMENTS

| | | | |
|---|---|---|---|
| 5,214,668 A | | 5/1993 | Satou et al. |
| 5,291,607 A | * | 3/1994 | Ristic et al. ................. 713/300 |
| 5,406,630 A | * | 4/1995 | Piosenka et al. ............... 380/52 |
| 5,485,127 A | | 1/1996 | Bertoluzzi et al. |
| 5,490,059 A | | 2/1996 | Mahalingaiah et al. |
| 5,546,810 A | | 8/1996 | Arikawa et al. |
| 5,626,425 A | | 5/1997 | Fujikawa et al. |
| 5,638,418 A | | 6/1997 | Douglass et al. |
| 5,781,075 A | | 7/1998 | Bolton, Jr. et al. |
| 5,781,718 A | | 7/1998 | Nguyen |
| 5,832,048 A | | 11/1998 | Woodman, Jr. |
| 5,836,691 A | | 11/1998 | Yamauchi |
| 5,838,578 A | * | 11/1998 | Pippin ........................... 716/4 |
| 5,870,614 A | | 2/1999 | Ang |
| 5,873,053 A | * | 2/1999 | Pricer et al. ................. 702/130 |
| 5,892,408 A | | 4/1999 | Binder |
| 5,892,448 A | | 4/1999 | Fujikawa et al. |
| 5,933,039 A | | 8/1999 | Hui et al. |
| 5,953,640 A | | 9/1999 | Meador et al. |
| 6,098,030 A | * | 8/2000 | McMinn ..................... 702/132 |
| 6,115,441 A | | 9/2000 | Douglass et al. |
| 6,219,723 B1 | | 4/2001 | Hetherington et al. |
| 6,362,699 B1 | | 3/2002 | Fry |
| 6,363,490 B1 | * | 3/2002 | Senyk ........................ 713/300 |
| 6,463,396 B1 | | 10/2002 | Nishigaki |
| 6,542,846 B1 | * | 4/2003 | Miller et al. ................. 702/132 |
| 2001/0021217 A1 | * | 9/2001 | Gunther et al. ............. 374/178 |
| 2003/0038648 A1 | | 2/2003 | Gold et al. |
| 2003/0052331 A1 | | 3/2003 | Gauthier et al. |
| 2003/0155903 A1 | | 8/2003 | Gauthier et al. |
| 2003/0155964 A1 | | 8/2003 | Gauthier et al. |
| 2003/0155965 A1 | | 8/2003 | Gauthier et al. |
| 2003/0156622 A1 | | 8/2003 | Gold et al. |
| 2003/0158683 A1 | | 8/2003 | Gauthier et al. |
| 2003/0158697 A1 | | 8/2003 | Gold et al. |

* cited by examiner

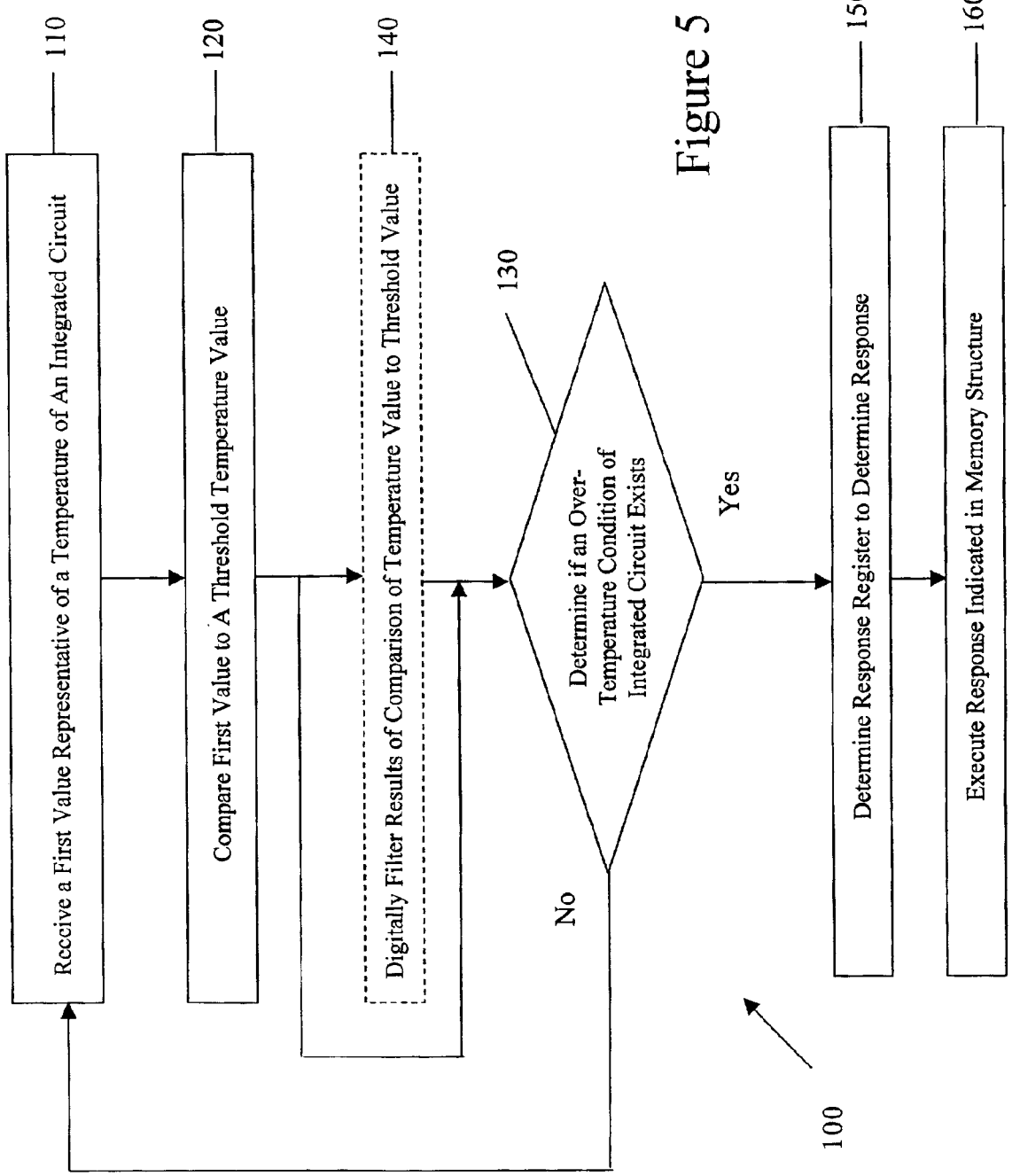

CONTROLLER FOR MONITORING TEMPERATURE

REFERENCE TO RELATED APPLICATIONS

The present invention relates to five other applications filed on the same date: A Method and System for Monitoring and Profiling an Integrated Circuit Die Temperature Ser No. 10/079,476, An Integrated Temperature Sensor Ser. No. 10/080,037, Quantifying a Difference Between Nodal Voltages Ser. No. 10/078,945, Low Voltage Temperature Independent and Temperature Dependent Voltage Generator Ser. No. 10/078,140 Temperature Calibration Using On-Chip Electrical Fuses Ser. No. 10/078,760.

TECHNICAL FIELD

The present invention generally relates to an integrated circuit, and more particularly, to a controller for monitoring and controlling the temperature of an integrated circuit.

BACKGROUND

Temperature gradients across the dies of today's high performance very large scale integration (VLSI) components, such as a microprocessor, can adversely affect component performance. For example, a temperature variation between two clock driver circuits within a microprocessor often results in a skew in the system clock of the microprocessor. Moreover, the die of the microprocessor may reach an unacceptable temperature that causes the microprocessor to malfunction or stop functioning.

To protect a microprocessor from thermal damage, a diode is typically placed in the die of the microprocessor to provide a die temperature indication. This diode is driven with a fixed amount of current, and the corresponding voltage drop across the diode provides an indication of the microprocessor temperature. Unfortunately, the diode provides a temperature indication that is accurate to about ±10° C., which is often not accurate enough to provide an early indication of a temperature abnormality. Moreover, because a single diode is typically utilized to monitor the die temperature of the entire microprocessor, only a single temperature indication is provided.

Given the size and complexity of integrated circuits, such as microprocessors, it is extremely difficult to determine and monitor a temperature gradient across the integrated circuit using only a single diode positioned at a location in the die of the integrated circuit. As such, substantial variations in temperature across the die of the integrated circuit can go undetected. Consequently, early indications that a thermal problem exists in a portion of the integrated circuit go undetected.

SUMMARY

The present invention addresses the above-described limitations of monitoring and controlling the temperature of an integrated circuit. The present invention provides a controller for monitoring and controlling the temperature of an integrated circuit to inhibit damage to the integrated circuit from thermal problems in the integrated circuit.

According to an embodiment of the present invention, a controller for monitoring a temperature of an integrated circuit is provided having a first interface for receiving a first value representative of a temperature of the integrated circuit. A second interface is also provided for receiving a second value representative of a threshold temperature. Furthermore, a comparator is provided for comparing the first value to the second value for determining whether the first value exceeds the second value, thereby determining if the first value indicates an excessive temperature of the integrated circuit.

According to a further embodiment of the present invention, a controller for monitoring a temperature of an integrated circuit is provided having means for receiving a plurality of first values representative of a temperature of the integrated circuit. Means for comparing the plurality of first values to a plurality of corresponding second values representative of a plurality of threshold temperatures are also provided. Also provided are means for determining whether an over-temperature condition of the integrated circuit exists.

A further embodiment of the invention involves a method having the act of receiving a plurality of first values representative of a temperature of the integrated circuit. These first values are then compared to a plurality of corresponding second values that are representative of a plurality of threshold temperatures. Finally, whether an over-temperature condition of the integrated circuit exists is determined if a first value represents a temperature that exceeds its corresponding threshold temperature.

BRIEF DESCRIPTION OF THE DRAWINGS

FIG. 5 is a flow diagram illustrating a method according to an embodiment of the present invention.

DETAILED DESCRIPTION

The illustrative embodiment of the present invention provides a temperature monitoring system for an integrated circuit that provides one or more die temperature measurements of the integrated circuit to actively monitor and/or control the die temperature across the integrated circuit. In the illustrative embodiment, the temperature monitoring system includes at least one active thermal sensor to sense a die temperature of an integrated circuit and a controller to determine if the temperature sensed by the active thermal sensor indicates an over-temperature condition in the integrated circuit.

As used herein, the term "buffer" includes a wide variety of structures capable of storing a value. Such structures include, but are not limited to, a register, a memory location, a memory circuit or other device, a transistor, magnetic storage, or electrical storage.

As used herein, the term "integrated circuit" refers to a wide variety of circuits. The present invention is not limited to any subset of integrated circuits as understood by one of ordinary skill in the art. Typically, the integrated circuit may include multiple circuit components formed on a single or multi-layer substrate.

A temperature of an integrated circuit or die, as used herein, refers to a temperature of at least a portion of a component of the integrated circuit or of some structure integrally formed with one or more components of the integrated circuit.

According to one embodiment, the present invention is attractive for use with integrated circuits that desire highly accurate and reliable die temperature measurements. The controller of the present invention is adapted to operate with a plurality of thermal sensors, independently reporting a temperature so that a geographically diverse temperature measurement of an integrated circuit can be obtained to avert an over-temperature condition.

An embodiment of the present invention allows for an active thermal sensor to be embedded in multiple die locations across the die of an integrated circuit, such as a microprocessor, to permit thermal profiling of the microprocessor as it executes various functions, for example various code streams. Thermal profiling may include obtaining one or more temperature values corresponding to various portions of the integrated circuit. Thermal profiling may relate to temperature conditions at a specific time or over a period of time. Thermal profiling may also include documenting thermal characteristics in relation to activities the integrated circuit is performing, such as executing code streams, idling, start-up or shut-down procedures, or operation during various failure modes of associated cooling devices.

Figure 1A:
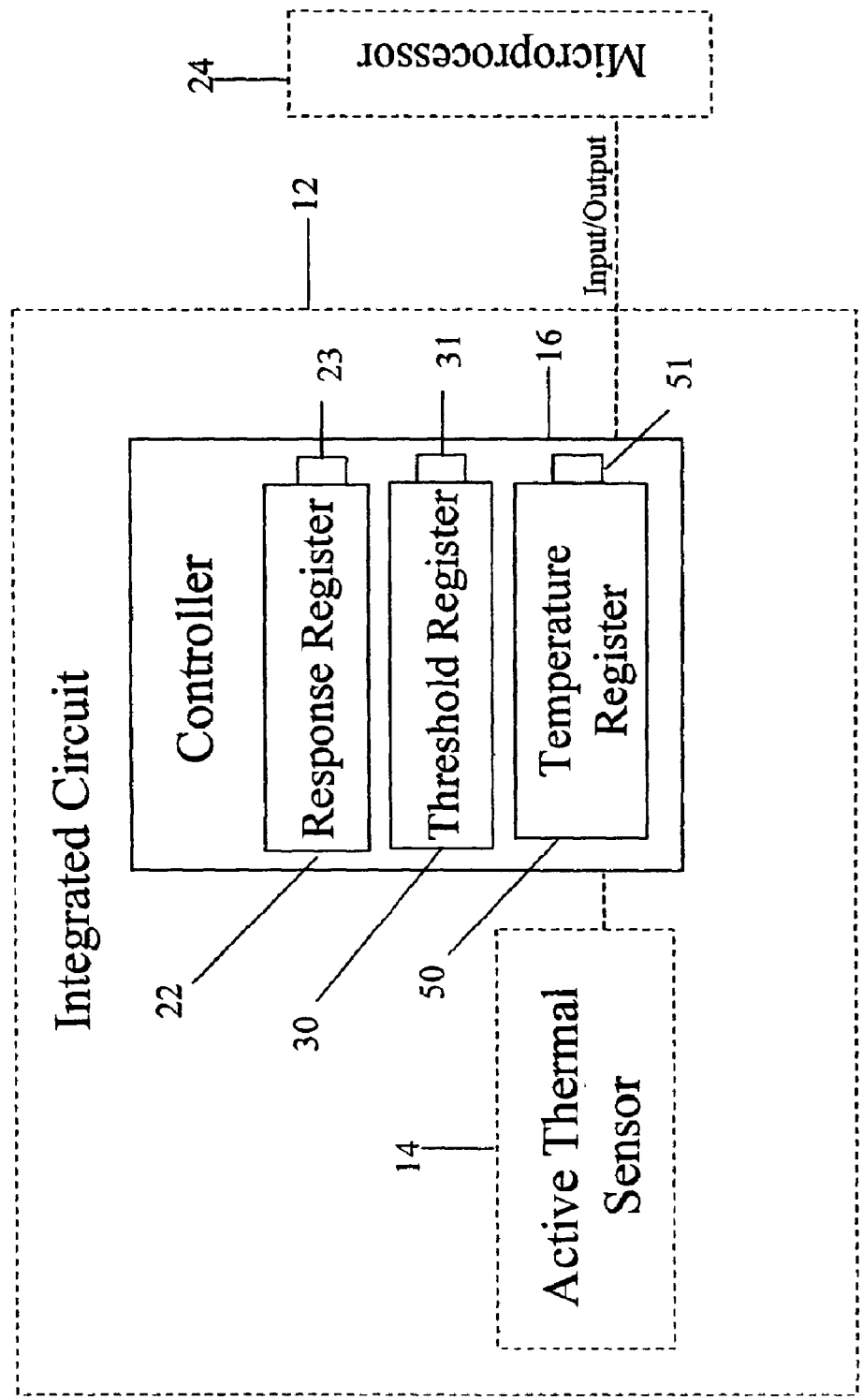
FIGS. 1A and 1B illustrate a controller to monitor and control a temperature of an integrated circuit with an optional active thermal sensor and optional microprocessor according to embodiments of the present invention.

FIG. 1A depicts an exemplary configuration for practicing the illustrative embodiment of the present invention. A controller 16 is provided on an integrated circuit 12. According to the illustrative embodiment, the controller 16 includes a buffer, such as a temperature measurement register 50, for receiving a value representative of a temperature of the integrated circuit 12. According to one embodiment of the invention, an interface 51 is provided to facilitate the retrieval of the value from the temperature measurement register 50. In such a case, the interface is adapted to communicate with a buffer located within or external to the controller 16 in order to obtain a value representative of a temperature of the integrated circuit 12. Therefore, the controller 16 may not be provided with a temperature measurement register 50, but may merely obtain a value from such a buffer located outside the controller 16 by the use of an interface 51. The interface 51 may be formed from a variety of structures, such as, for example, a portion of an integrated circuit, a wire or an optical coupling.

Figure 1B:
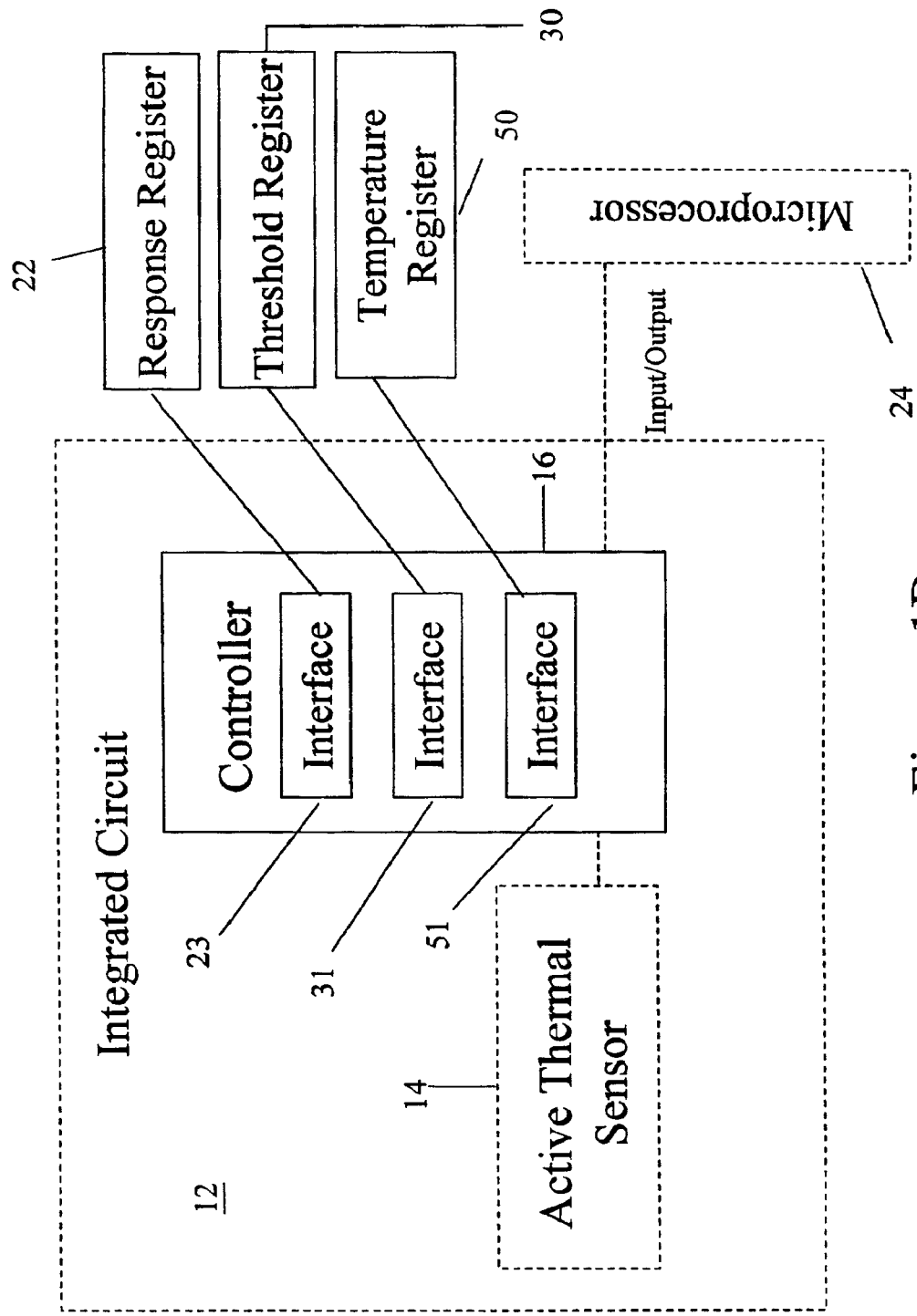

A buffer, such as a threshold register 30, is also provided for storing a value representative of a threshold temperature. Similar to the temperature measurement register 50, the threshold register 30 may be located in the controller 16. As shown in FIG. 1B, according to one embodiment of the invention, an interface 31 is provided to facilitate the retrieval of the value from the threshold register 30. In such a case, the interface 31 is adapted to communicate with a buffer located within or external to the controller 16 in order to obtain a value representative of a threshold temperature. The interface 31 may be formed from a variety of structures, such as, for example, a portion of an integrated circuit, a wire or an optical coupling.

An excessive temperature is indicated if the temperature of the integrated circuit, as represented by the value in the temperature measurement register 50, exceeds the threshold temperature. A response register 22 is also optionally provided to specify an action to be taken if an over-temperature condition of the integrated circuit is determined to exist. As described above in relation to the interfaces 51, 31 optionally used in conjunction with the temperature measurement register 50 and threshold register 30, a further interface 23 may be provided for use with the response register 22. Therefore, the response register 22 may be located within or outside the controller 16.

Those skilled in the art will appreciate that the depictions in FIGS. 1A and 1B are intentionally simplified to assist in understanding the illustrative embodiment. Alternative configurations may be used to practice the present invention. For example, the embodiments of FIGS. 1A and 1B may be combined, resulting in some buffers located on the controller 16 and some buffers located external to the controller 16.

A microprocessor 24 may interface with the controller 16 as shown in FIGS. 1A and 1B. The microprocessor 24 may write values into the threshold register 30 and the response register 22. Also, the microprocessor 24 may read the contents of the temperature measurement register 50. The controller 16 is capable of monitoring and/or controlling the temperature of the integrated circuit 12 without communication with the microprocessor 24.

A value representative of a temperature of the integrated circuit 12 may be provided in a variety of ways, such as by one or more diodes or by the use of other temperature sensors. According to an illustrative embodiment, as shown in FIG. 1A or 1B, one or more active thermal sensors 14 are provided in thermal communication with the integrated circuit 12 in order to each provide a signal to the controller 16. The active thermal sensor 14 senses a die temperature of the integrated circuit 12 and reports a digital value to the controller 16 that represents the sensed die temperature at the location of the active thermal sensor 14. The active thermal sensor 14 senses and reports a temperature value that represents either an absolute or relative die temperature at the sensor's location. According to an example, the value reported by the active thermal sensor 14 is a digital value typically containing 11 bits with a measurement accuracy of ±1.5° C. Those skilled in the art will recognize that the active thermal sensor 14 can be adapted to report a data unit with more than eleven bits of data or less than eleven bits of data without departing from the scope of the illustrative embodiment of the present invention. Furthermore, according to variations of the invention, a temperature sensor may provide an electrical signal, such as a voltage or resistance level, to be converted to a digital value by the controller 12.

The thermal sensor 14 may provide a signal to the controller 16 in variety of ways. For example, a single electrical wire may be used to enable serial communication of data. A plurality of wires may be used to enable faster transfer of data. For example, if a 4-bit data word size is used, the use of four wires would enable the entire data word to be sent simultaneously. Further variations include optical transmission of data through one or more optical channels. Design considerations, such as the limited availability of wiring through portions of the integrated circuit, may favor one alternative over another. It is also within the scope of the invention to use a variety of alternatives from one thermal sensor 14 to the next. For example, some thermal sensors 14 may use a single wire, while others use a plurality of wires. Further variations of communicating data may be apparent to one of skill in the art and are within the scope of the invention.

Although the controller 16 is illustrated as being located on the integrated circuit 12, the invention is not so limited. The controller 16 may be independent of the integrated circuit 12. Moreover, the controller may hold temperature measurement registers and threshold registers where each temperature measurement register and corresponding threshold register are associated with a particular sensor.

Figure 2:
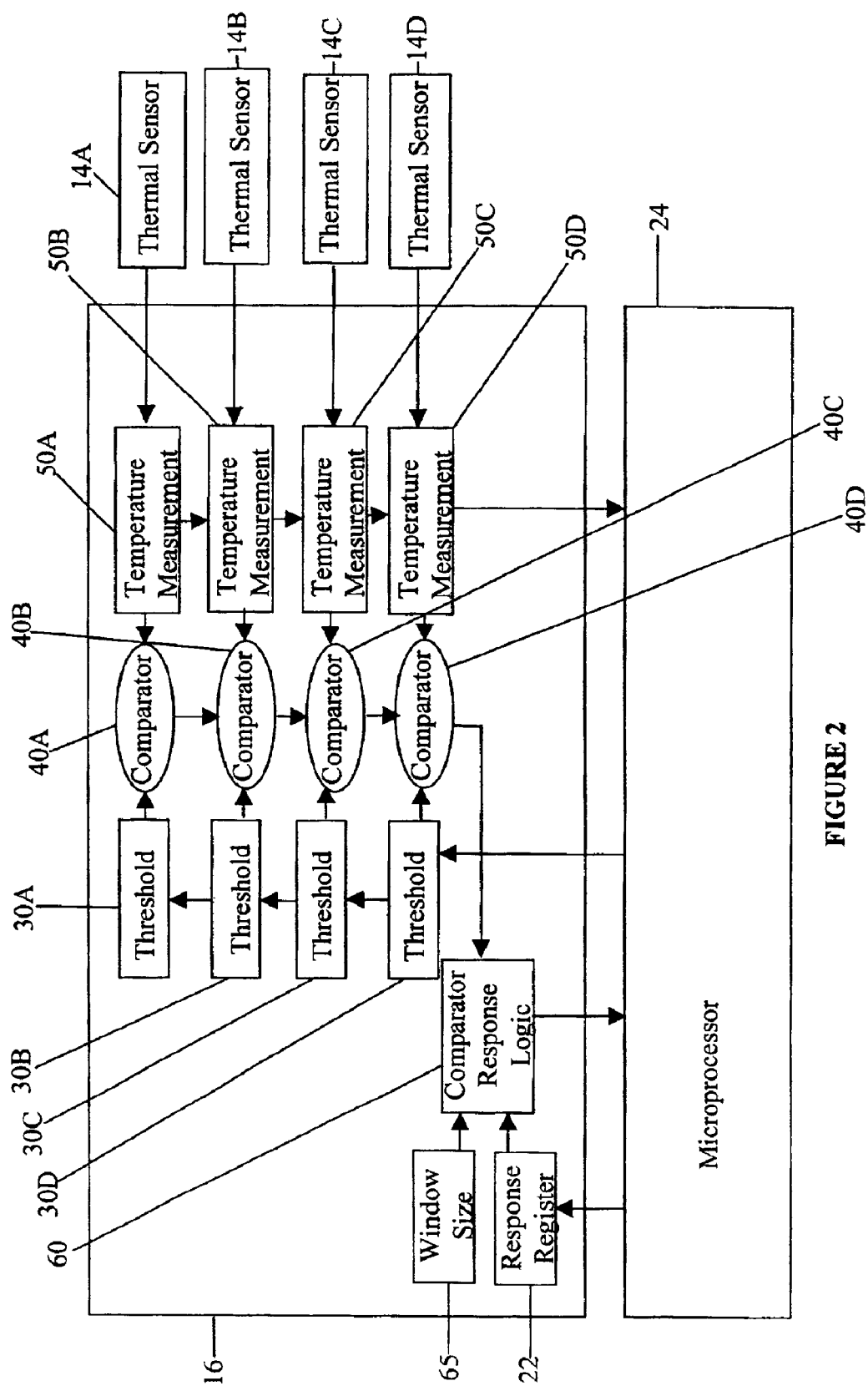
FIG. 2 illustrates a controller adapted to communicate with temperature sensors arranged in parallel according to an embodiment of the present invention.

As illustrated in FIG. 2, according to the illustrative embodiment of the invention, the controller 16 may be configured to communicate in parallel with a plurality of active thermal sensors 14A, 14B, 14C, 14D. The controller 16 is provided with temperature measurement registers 50A, 50B, 50C, 50D corresponding to respective active thermal sensors 14A, 14B, 14C, 14D. The temperature measurement register 50 stores a temperature value from the active thermal sensor 14. A threshold register 30A, 30B, 30C, 30D is also provided to correspond with each of the temperature measurement registers 50A, 50B, 50C, 50D. Therefore, a threshold temperature may be individually established for each of the temperature measurement registers. Such a capability allows lower thresholds to be optionally set for temperature measurement registers corresponding to portions of the integrated circuit expected to remain cooler. Likewise, higher threshold temperatures may be set for temperature measurement registers corresponding to portions of the integrated circuit that typically run warmer than other portions. Optionally, a lesser number of threshold registers may be provided, such that a threshold register would correspond to multiple temperature measurement registers 50.

According to an embodiment of the invention, a comparator 40A, 40B, 40C, 40D is provided to correspond with each of the temperature measurement register 50 and threshold register 30 pairings. As illustrated in FIG. 2, the comparator 40 compares the values of the threshold register 30 and the temperature measurement register 50 and passes a result to a comparator response logic 60. According to a variation of the invention, one or more multiplexers or other devices can be used in order to compare the temperature measurement register 50 contents to the contents of the corresponding threshold register 30. In such a configuration, only one comparator may be used. According to a further variation of the invention, another circuit providing similar functionality may be used in place of a comparator.

The comparator response logic 60 is in communication with the comparator 40. The comparator response logic 60 digitally filters the results obtained by the comparator 40 to determine if an over-temperature condition of the integrated circuit exists. The comparator 40 compares a temperature value in the temperature measurement register 50 with the threshold temperature value stored in the threshold register 30. The comparator response logic 60 obtains values from each of the comparators 40A, 40B, 40C, 40D.

According to an illustrative embodiment, a window size register 65 is provided for access by the comparator response logic 60. The window size register 65 provides a value referring to a threshold number of results from the comparator 40 before a response is executed by the controller 16. By way of example, the window size register 65 may contain a value of 4. In such a case, the comparator response logic, if operating as an up/down counter, would maintain a running count of results from the comparator 40 until the count exceeds the value of the window size register 65. For example, if the comparator 40 provides three excessive temperature indications and one normal temperature indication, the up/down counter within the comparator response logic 60 would have a value of 2. Further, normal temperature indications would each reduce the value by 1, down to a minimum of 0.

The value stored in the window size register 65 allows the controller 16 to filter out an incorrect comparator 40 result caused by a erroneous temperature measurement value stored in the temperature measurement register 50. The value stored in the window size register 65 can be determined either through various statistical techniques, through trial and error or through any other suitable technique to filter or remove an erroneous comparator 40 result. Erroneous temperature measurement values causing such comparator 40 results can be caused by spurious electrical signals, interference, manufacturing defects, or other causes resulting in values received into the temperature measurement register 50 not representative of a temperature experienced by a corresponding temperature sensor.

Optionally, the comparator response logic 60 may command a response when the window size register 65 count is equaled. Furthermore, the comparator response logic 60 may act not as an up/down counter but as only an up counter, in such a case, the comparator response logic 60 may require a certain number of consecutive excessive temperature indications, or may alternatively require only a total cumulative number of excessive temperature indications.

Those skilled in the art will recognize that the value stored in the window size register 65 can be 1. In such a case, the comparator response logic 60 will promptly determine that an over-temperature condition of the integrated circuit exists upon the detection of a single excessive temperature indication from the comparator 40.

A response register 22 is provided in communication with the comparator response logic 60 in order to specify a response in the event of an over-temperature condition of the integrated circuit. A value representative of the specific response to be commanded is stored in the response register 22. In the event that sufficient excessive temperature indications are obtained from the comparator 40, the comparator response logic 60 commands the action for response as specified by the response register 22.

As discussed above, the particular type of response the controller 16 executes when an over-temperature condition of the integrated circuit occurs is determined by the content of the response register 22. The responses are encoded in values stored in the response register. Typical actions that the controller 16 can execute upon determination that an over-temperature condition exists include, but are not limited to, assert an over-temperature pin of the integrated circuit 12, assert an over-temperature bit in an error register of the controller 16 or the integrated circuit 12 or the microprocessor 24, issue an over-temperature interrupt to a service bus of the integrated circuit 12, cause a trap, slow down the operating frequency of the integrated circuit 12, stop the integrated circuit 12, or do nothing. Those skilled in the art will recognize that the list of responses is merely exemplary and that other response possibilities can be executed by the controller 16 in response to a detection of an over-temperature condition of the integrated circuit.

A microprocessor 24 is optionally provided according to an embodiment of the present invention. The microprocessor 24 can communicate with the controller 16 in order to provide information to the controller 16, manipulate the controller 16, or to obtain information from the controller 16. For example, the content of the response register 22 may be provided by the microprocessor 24. The contents of each of the threshold registers 50 may also be provided by the microprocessor 24. Alternatively, the content of both of these registers may be burned in upon manufacture or entered in another manner.

Over-temperature condition determinations or current count status of excessive temperature indications can be forwarded by the comparator response logic 60 to the microprocessor 24. Furthermore, the specific response to be executed may be forwarded to the microprocessor 24 for execution, or may be forwarded directly by the controller 16 to the appropriate component for execution.

Information relating to specific temperature values can also be provided to the microprocessor 24. The controller 16 can shift the contents of the temperature measurement register 50, or each of a plurality of temperature measurement registers, to the microprocessor 24 when polled by the microprocessor 24. Also, the microprocessor 24 can read the contents of the response register 22 or the threshold registers 30.

The microprocessor 24 may be connected to the controller 16 by the use of an interface at specific times in order to communicate with the controller 16 as needed. Alternatively, the microprocessor 24 may be connected to the controller 16 by the use of a full-time interface. The controller 16 is capable of determining over-temperature conditions of the integrated circuit without the use of the microprocessor 24. Furthermore, according to an embodiment of the invention, the controller 16 may execute responses to over-temperature conditions without communicating with the microprocessor 24.

According to an alternative embodiment, the controller 16 has a DEBUG mode of operation. The DEBUG mode enables values to be written to the temperature measurement registers 50, independent of temperature sensor 14 output, for testing the controller 16 under various conditions. In this mode of operation, contents of the threshold registers 30A, 30B, 30C and 30D as well as the temperature measurement registers 50A, 50B, 50C and 50D may be provided by the microprocessor 24. Optionally, the contents of the window size register 65 and/or the response register 22 may also be provided. By monitoring the response of the controller 16 from the comparator control response logic 60, the correct functioning of the controller 16 can be verified. The DEBUG mode of operation can be employed as a part of the controller 16 power-up or triggered by the microprocessor 24 at any time to ensure that the controller 16 is active and properly functioning.

Figure 3:
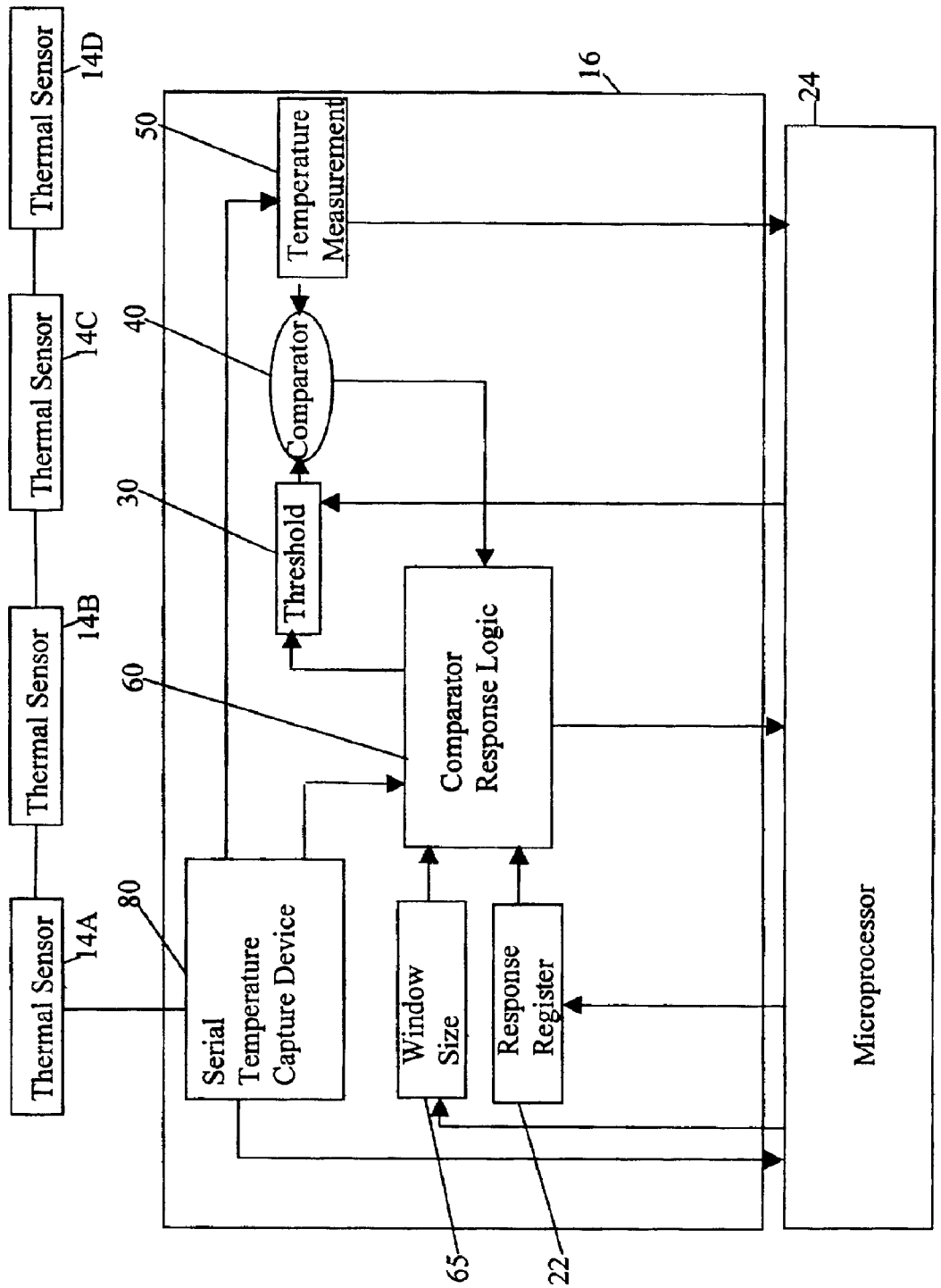
FIG. 3 illustrates a controller adapted to communicate with temperature sensors arranged in series according to a further embodiment of the present invention.

A further embodiment of a controller 16 according to the present invention is illustrated in FIG. 3. The controller 16 of FIG. 3 is configured to communicate with temperature sensors 14 arranged serially. The controller 16 of FIG. 3 is similar in operation to the controller 16 of FIG. 2, with the exception of the accommodation of the communications with the temperature sensors arranged serially. In this embodiment, because only one temperature value is received by the controller 16 at a time, only one temperature measurement register 50, comparator 40 and threshold register 30 are required when operating the controller 16 with multiple temperature sensors.

In order to manage the communications with temperature sensors 14A, 14B, 14C, 14D arranged serially, a serial temperature capture device 80 is provided. The serial temperature capture device 80 receives serial data from one or more temperature sensors 14 and serially writes the temperature value to the temperature measurement register 50. The serial temperature capture device 80 also provides information to identify the specific temperature sensor 14 to the comparator control response logic 60 to enable the comparator control response logic 60 to insert a value corresponding to the appropriate threshold temperature for the specific temperature sensor 14 into the threshold register 30. The serial temperature capture device 80 may communicate with the temperature sensors in a variety of ways. As will be apparent to one in the art, a variety of optional methods of operating a serial communication link may be performed, and are within the scope of the invention, to ensure accurate data transmission and provide rapid transfer of data.

As discussed above in relation to an earlier embodiment, the thermal sensor 14 may provide a signal to the controller 16 in variety of ways. For example, the signal may be provided from the thermal sensors 14 arranged serially to the controller 16 by the use of a single wire, a plurality of wires or optically. Also, a combination of these alternatives may be employed for use with a single controller 16.

Optionally, the serial temperature capture device 80 can also interface directly with the optional microprocessor 24 to provide temperature values or information to identify the specific temperature sensor 14 to enable the microprocessor 24 to determine the temperature sensor corresponding to the temperature value stored in the temperature measurement register 50.

In operation, the controller 16 of FIG. 3 uses the comparator 40 to compare the values of the threshold register 30 and the temperature measurement register 50 and passes a result to a comparator response logic 60. As described in relation to the comparator 16 of FIG. 2, comparator response logic 60 determines whether an over-temperature condition in the integrated circuit exists.

Figure 4:
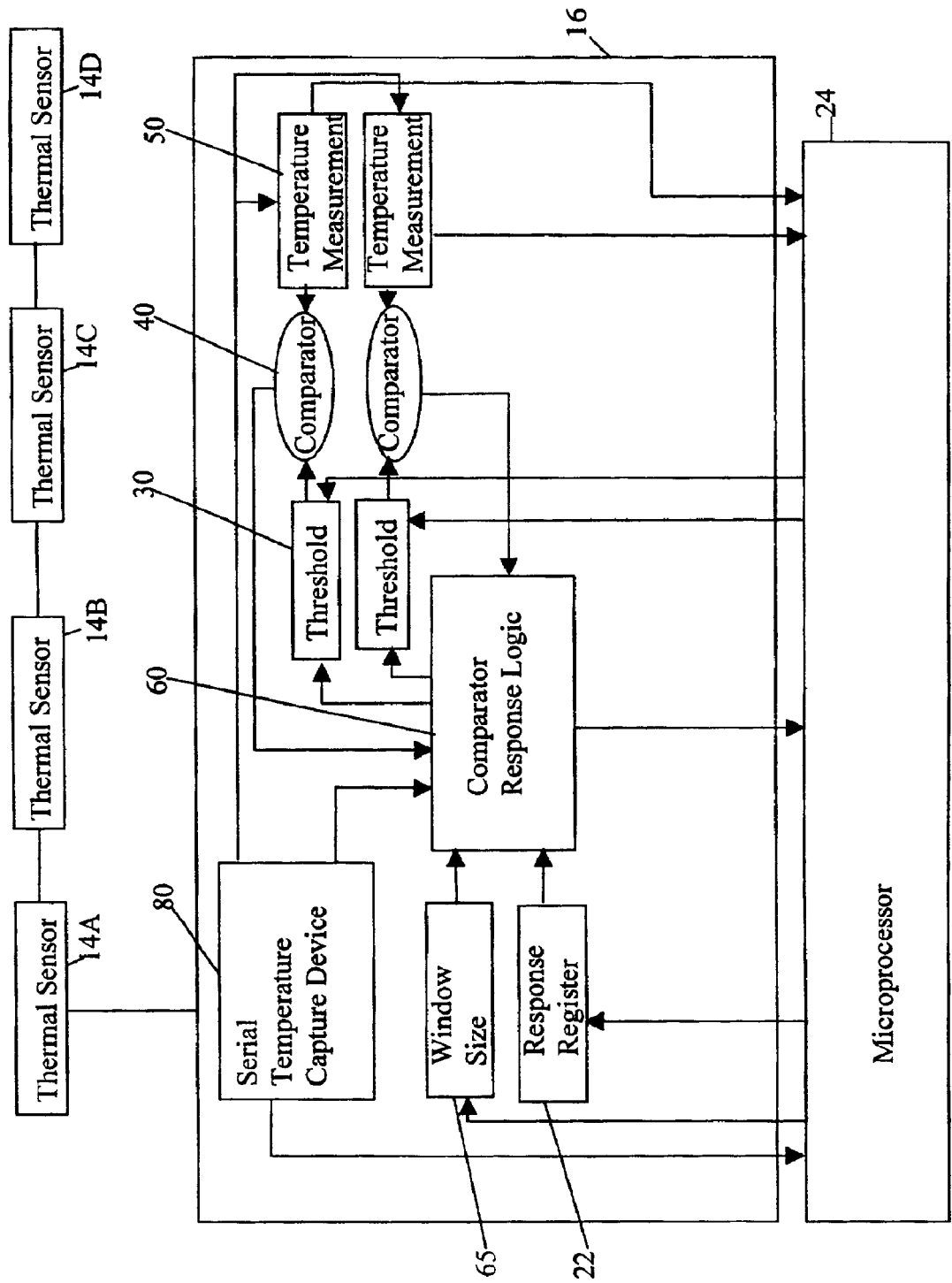
FIG. 4 illustrates a controller adapted to communicate with temperature sensors arranged in series and having multiple temperature-measurement registers according to a further embodiment of the present invention.

A further embodiment of the invention is illustrated in FIG. 4. This embodiment combines the serial temperature capture device 80 with a plurality of temperature measurement registers 50. Optionally, a plurality of comparators 40 and threshold registers 30 are also provided. According to this embodiment, the serial temperature capture device 80 obtains values representative of a temperature of the integrated circuit from thermal sensors 14 arranged serially. The serial temperature capture device 80 then writes or directs the value to a temperature measurement register 50. As described above in relation to another embodiment, a comparator 40 compares the values of a threshold register 30 and the temperature measurement register 50 and passes a result to a comparator response logic 60. Alternatively or in addition, one or more multiplexers or other devices can be used in order to compare the contents of a plurality of temperature measurement registers 50 to the contents of a threshold register 30. In such a configuration, only one comparator 40 or multiple comparators 40 may be used.

A method 100 according to an embodiment of the present invention is illustrated in FIG. 5. The method 100 includes the act of receiving a plurality of first values representative of a temperature of the integrated circuit, act 110. These first values are then compared to a plurality of corresponding second values that are representative of a plurality of threshold temperatures, act 120. Finally, whether an over-temperature condition of the integrated circuit exists is determined if a first value represents a temperature that exceeds its corresponding threshold temperature, act 130.

Optionally, an over-temperature condition of the integrated circuit is determined by digitally filtering the results of comparing the first values representative of a temperature of the integrated circuit and the second values that are representative of a plurality of threshold temperatures, act 140. Such results are assessed according to a pre-determined threshold count. As described above, the count may be performed in a variety of ways and serves to avoid false determinations of over-temperature conditions by requiring a sufficient number of excessive temperature indications.

According to a variation of the invention, a further act 150 of determining a response to the over-temperature condition may be performed. According to one embodiment of the invention, a response to be performed is designated by a value stored in the response register 22. The determined response may then be executed, act 160.

According to various embodiments of the present invention, thermal monitoring and control of the integrated circuit 12 can be readily accomplished. The benefit of thermal monitoring can be significant especially when the integrated circuit 12 is a microprocessor that executes various code streams.

The present invention has been described by way of example, and modifications and variations of the described embodiments will suggest themselves to skilled artisans in this field without departing from the spirit of the invention. Aspects and characteristics of the above-described embodiments may be used in combination. The described embodiments are merely illustrative and should not be considered restrictive in any way. The scope of the invention is to be measured by the appended claims, rather than the preceding description, and all variations and equivalents that fall within the range of the claims are intended to be embraced therein.

The described embodiments are meant to be illustrative and not limiting. For example, the controller 16 can be configured to recognize a signal from a temperature sensor indicating that a temperature value is available. Moreover, the functions provided by the microprocessor 24 can be incorporated into the controller 16 to further reduce the number of interfaces with the controller 16. In addition, the temperature sensors and the controller 16 can communicate in either a uni-directional or bi-directional manner.

What is claimed is:

1. A controller for monitoring a temperature of an integrated circuit, comprising:
   a first interface for receiving a first value representative of an temperature of said integrated circuit, the first value is produced by one of an active thermal sensor and a passive thermal sensor formed in said integrated circuit;
   a second interface for receiving a second value representative of a threshold temperature;
   a comparator for comparing said first value to said second value; and
   a comparator response logic coupled to said comparator for determining in response to a comparison of said first value to said second value by said comparator whether an over-temperature condition in said integrated circuit exists.

2. The controller of claim 1, further comprising a temperature measurement buffer for holding said first value received from said first interface.

3. The controller of claim 2, further comprising a serial temperature capture device for receiving a plurality of temperatures of said integrated circuit and sequentially providing said plurality of temperatures of said integrated circuit to said temperature measurement buffer.

4. The controller of claim 3, wherein said serial temperature capture device is adapted to receive a plurality of temperatures from a plurality of thermal sensors.

5. The controller of claim 3, further comprising a threshold buffer corresponding to said temperature measurement buffer and adapted to store a second value representative of a threshold temperature.

6. The controller of claim 5, wherein said threshold buffer is located external to said controller.

7. The controller of claim 2, wherein said temperature measurement buffer is adapted to receive said first value by way of a single wire.

8. The controller of claim 2, wherein said temperature measurement buffer is adapted to receive said first value by way of a plurality of wires.

9. The controller of claim 2, further comprising a microprocessor adapted to communicate with said temperature measurement buffer to read said first value and thermally profile said integrated circuit.

10. The controller of claim 2, wherein said temperature measurement buffer is located external to said controller.

11. The controller of claim 1, further comprising:
    a plurality of temperature measurement buffers, wherein each temperature measurement buffer is adapted to receive a value representative of a temperature of an integrated circuit.

12. The controller of claim 11, wherein at least one of said plurality of temperature measurement buffers is located external to said controller.

13. The controller of claim 11, further comprising:
    a serial temperature capture device for receiving a plurality of temperatures of said integrated circuit and providing said plurality of temperatures of said integrated circuit to said plurality of temperature measurement buffers.

14. The controller of claim 11, wherein at least one of said plurality of said temperature measurement buffers adapted to receive said first value by way of a single wire.

15. The controller of claim 11, wherein at least one of said plurality of said temperature measurement buffers is adapted to receive said first value by way of a plurality of wires.

16. The controller of claim 11, further comprising a microprocessor adapted to communicate with said plurality of temperature measurement buffers to read said values representative of temperatures of an integrated circuit and thermally profile said integrated circuit.

17. The controller of claim 11, further comprising a plurality of threshold buffers corresponding to said plurality of temperature measurement buffers and adapted to store a plurality of second values representative of threshold temperatures.

18. The controller of claim 1, further comprising:
    a window size buffer adapted to store a window size value and coupled to said comparator response logic;
    wherein said comparator response logic operates as an up/down counter, counting said over-temperature conditions and determining whether an over-temperature condition in said integrated circuit exists when said up/down counter reaches said window size value.

19. The controller of claim 1, further comprising:
    a window size buffer adapted to store a window size value and coupled to said comparator response logic;
    wherein said comparator response logic operates as a counter, counting said over-temperature conditions occurring sequentially and determining whether an over-temperature condition in said integrated circuit exists when said counter reaches said window size value.

20. The controller of claim 1, wherein said comparator response logic uses digital filtering to filter said first value representative of a temperature of said integrated circuit.

21. The controller of claim 1, further comprising a response buffer coupled to said comparator response logic for storing a value representative of a response to said over-temperature condition.

22. The controller of claim 21, wherein said response comprises one of the group of assert an over-temperature pin, assert an over-temperature bit in an error buffer of said controller, assert an over-temperature bit in an error buffer of said microprocessor, issue an over-temperature interrupt to a service bus of said integrated circuit, cause a trap, slow an operating frequency of said integrated circuit, stop said integrated circuit, and do nothing.

23. The controller of claim 21, further comprising an interface from said response buffer to a microprocessor to enable said microprocessor to write to said response buffer.

24. The controller of claim 23, further comprising said microprocessor.

25. The controller of claim 1, further comprising an interface from said comparator response logic to a microprocessor to enable said microprocessor to communicate with said comparator response logic.

26. The controller of claim 25, further comprising said microprocessor.

27. The controller of claim 1, further comprising an interface from said first interface to a microprocessor to enable said microprocessor to read said first interface.

28. The controller of claim 1, further comprising an interface from said second interface to a microprocessor to enable said microprocessor to write to said second interface.

* * * * *